(12) United States Patent
Xiao (10) Patent No.: US 10,259,144 B2
(45) Date of Patent: Apr. 16, 2019

(54) LASER SINTERING APPARATUS AND LASER SINTERING METHOD

(71) Applicants: BOE TECHNOLOGY GROUP CO., LTD., Beijing (CN); ORDOS YUANSHENG OPTOELECTRONICS CO., LTD., Ordos (CN)

(72) Inventor: Ang Xiao, Beijing (CN)

(73) Assignees: BOE TECHNOLOGY GROUP CO., LTD., Beijing (CN); ORDOS YUANSHENG OPTOELECTRONICS CO., LTD., Ordos (CN)

(*) Notice: Subject to any disclaimer, the term of this patent is extended or adjusted under 35 U.S.C. 154(b) by 664 days.

(21) Appl. No.: 14/894,869

(22) PCT Filed: May 21, 2015

(86) PCT No.: PCT/CN2015/079489
§ 371 (c)(1),
(2) Date: Nov. 30, 2015

(87) PCT Pub. No.: WO2016/095427
PCT Pub. Date: Jun. 23, 2016

(65) Prior Publication Data
US 2016/0361843 A1    Dec. 15, 2016

(30) Foreign Application Priority Data

Dec. 15, 2014    (CN) .......................... 2014 1 0777659

(51) Int. Cl.
*B29C 35/08*    (2006.01)
*H01L 51/56*    (2006.01)
(Continued)

(52) U.S. Cl.
CPC ...... *B29C 35/0805* (2013.01); *H01L 51/5246* (2013.01); *H01L 51/56* (2013.01);
(Continued)

(58) Field of Classification Search
CPC ............ B29C 35/0805; B29C 35/0838; B29C 2035/0838; H01L 51/5246; H01L 51/56; C03C 27/04; C03C 27/06
See application file for complete search history.

(56) References Cited

U.S. PATENT DOCUMENTS

| 5,393,482 A | 2/1995 | Benda et al. |
| 6,373,025 B1 | 4/2002 | Takeuchi et al. |
(Continued)

FOREIGN PATENT DOCUMENTS

| CN | 1135731 A | 11/1996 |
| CN | 102403466 A | 4/2012 |
(Continued)

OTHER PUBLICATIONS

Second Office Action regarding Chinese application No. 201410777659.8, dated Nov. 16, 2016. Translation provided by Dragon Intellectual Property Law Firm.
(Continued)

*Primary Examiner* — Yogendra N Gupta
*Assistant Examiner* — Joseph S Leyson
(74) *Attorney, Agent, or Firm* — Harness, Dickey & Pierce, P.L.C.

(57) ABSTRACT

The present disclosure provides a laser sintering apparatus and a laser sintering method. The laser sintering apparatus includes a first laser head configured to output a laser beam at a first power level, a second laser head configured to output a laser beam at a second power level, and a driving device configured to drive the first laser head and the second laser head to move, so as to enable the first laser head and the second laser head to heat an identical region of a to-be-sintered material.

14 Claims, 4 Drawing Sheets

(51) Int. Cl.
*H01L 51/52* (2006.01)
*C03C 27/06* (2006.01)
*B22F 3/105* (2006.01)

(52) U.S. Cl.
CPC .............. *B22F 2003/1056* (2013.01); *B29C 2035/0838* (2013.01); *C03C 27/06* (2013.01); *Y02P 10/295* (2015.11)

(56) References Cited

U.S. PATENT DOCUMENTS

| 2012/0111059 A1* | 5/2012 | Watanabe | C03C 8/24 65/43 |
| 2012/0131959 A1 | 5/2012 | No et al. | |

FOREIGN PATENT DOCUMENTS

| CN | 102471152 A | 5/2012 |
| CN | 102881844 A | 1/2013 |
| CN | 104466033 A | 3/2015 |
| CN | 204289543 U | 4/2015 |

OTHER PUBLICATIONS

Written Opinion of the International Searching Authority and International Search Report regarding International Application No. PCT/CN2015/079489, dated Sep. 23, 2015. Translation provided by Dragon Intellectual Property Law Firm.

Office Action regarding Chinese Patent Application No. 201410777659.8, dated May 4, 2016. Translation provided by Dragon Intellectual Property Law Firm.

* cited by examiner

LASER SINTERING APPARATUS AND LASER SINTERING METHOD

CROSS-REFERENCE TO RELATED APPLICATIONS

This application is the U.S. national phase of PCT Application No. PCT/CN2015/079489 filed on May 21, 2015, which claims a priority to Chinese Patent Application No. 201410777659.8 filed on Dec. 15, 2014, the disclosures of which are incorporated in their entirety by reference herein.

TECHNICAL FIELD

The present disclosure relates to the manufacture of display devices, in particular to a laser sintering apparatus and a laser sintering method.

BACKGROUND

For an organic light-emitting diode (OLED) display device, a light-emitting material is driven by a current to emit light autonomously. Since the light-emitting material in the OLED display device is sensitive to temperature, air and water, good packaging is very important for the lifetime and image quality of the OLED display device. There are many technologies for packaging the OLED display device, for example, laser packaging, thin-film packaging, injection packaging, etc. The laser packaging is currently a mature technology for packaging the OLED display device, and its main operating principle is to heat and melt, in a precise and quick manner, a glass cement at a specific position between two glass substrates (one is a cover plate, while the other is a back plate on which the light-emitting material and a circuit pattern are formed) by using a laser beam, thereby to package the two substrates.

During a conventional laser sintering process, the glass cement may instantaneously be heated to a temperature of 800° C. to 1000° C. from the room temperature, and then be cooled down to the room temperature. A shrinkage stress may be accumulated inside the glass cement during the quick heating and cooling, resulting in cracks and even breakages in subsequent processes. Currently, there are substantially two methods to overcome this drawback. The first method is to reduce the shrinkage stress by decreasing thermal expansion coefficients of the glass substrates and the glass cement. The second method is to decrease a laser sintering speed. However, for the first method, the materials of the glass substrates and the glass cement will be greatly restricted, while for the second method, it is not applicable to mass production. Hence, the manufacture of OLED display device is greatly restricted by these methods.

SUMMARY

An object of the present disclosure to provide a laser sintering apparatus and a laser sintering method, so as to prevent the occurrence of cracks or even breakages in a glass cement due to a large shrinkage stress generated by the laser sintering when an existing display device is packaged using a laser beam.

In one aspect, the present disclosure provides in some embodiments a laser sintering apparatus, including: a first laser head configured to output a laser beam at a first power level, a second laser head configured to output a laser beam at a second power level, and a driving device configured to drive the first laser head and the second laser head to move, thereby to enable the first laser head and the second laser head to heat an identical region of a to-be-sintered material.

Alternatively, the laser sintering apparatus further includes a third laser head configured to output a laser beam at a third power level, where the third power level and the first power level are each smaller than the second power level. The driving device is further configured to move the third laser head, thereby to enable the first laser head, the second laser head and the third laser head to heat the identical region of the to-be-sintered material.

Alternatively, the driving device is configured to drive the first laser head and the second laser head to move simultaneously at an identical speed.

Alternatively, the driving device includes: a first controlling structure configured to enable the first laser head, the second laser head and the third laser head to move along a first direction at an identical speed to scan the to-be-sintered material; and a second controlling structure configured to adjust positions of the first laser head, the second laser head and/or the third laser head, thereby to enable a direction from the second laser head to the first laser head and a direction from the third laser head to the second laser head to be identical to the first direction.

Alternatively, the laser sintering apparatus further includes a fixation platform, a circular rail is provided on the fixation platform, the second laser head is fixedly arranged at a center of a region surrounded by the circular rail, and the first laser head and the third laser head are arranged on the circular rail and located at two sides of the second laser head, respectively.

Alternatively, the driving device includes a first motor which is connected to the first laser head and configured to enable the first laser head to move along the circular rail, and a second motor which is connected to the third laser head and configured to enable the third laser head to move along the circular rail.

Alternatively, the first power level and the third power level are each smaller than the second power level by 20% to 40%.

Alternatively, a distance from the second laser head to the first laser head and a distance from the second laser head to the third laser head both range from 2 mm to 5 mm.

Alternatively, light paths of the laser beams from the first laser head, the second laser head and the third laser head are parallel to each other.

In another aspect, the present disclosure provides in some embodiments a laser sintering method using the above-mentioned the laser sintering apparatus, including steps of: outputting, by a first laser head, a laser beam at a first power level; outputting, by a second laser head, a laser beam at a second power level; and moving the first laser head and the second laser head to heat an identical region of a to-be-sintered material.

Alternatively, the laser sintering method further includes: outputting, by a third laser head, a laser beam at a third power level, the third power level and the first power level being smaller than the second power; and heating the identical region of the to-be-sintered material by the first laser head, the second laser head and the third laser head.

Alternatively, the step of heating the identical region of the to-be-sintered material by the first laser head, the second laser head and the third laser head includes moving the first laser head, the second laser head and the third laser head along a first direction at an identical speed to scan the identical region of the to-be-sintered material.

Alternatively, the step of moving the first laser head, the second laser head and the third laser head along the first direction at the identical speed further includes: adjusting positions of the first laser head, the second laser head and/or the third laser head, thereby to enable a direction from the second laser head to the first laser head and a direction from the third laser head to the second laser head to be identical to the first direction.

Alternatively, the first power level and the third power level are each smaller than the second power level by 20% to 40%.

Alternatively, in the step of heating the identical region of the to-be-sintered material by the first laser head and the second laser head, the first laser head and the second laser head move simultaneously at an identical speed.

In yet another aspect, the present disclosure provides in some embodiments a laser sintering method, including steps of: outputting laser beams at different power levels by a first laser head and a second laser head; and driving the first laser head and the second laser head to move along a distribution trajectory of a to-be-sintered material in a first direction at an identical speed, thereby to enable the first laser head to heat a first region along the distribution trajectory and enable the second laser head to heat a second region along the distribution trajectory adjacent to the first region; where a direction from the second region to the first region is the first direction; and one of a power level of a laser beam output by the first laser head and a power level of a laser beam output by the second laser head is larger than or equal to a minimum power level desired for sintering the to-be-sintered material, and the other one of the power level of the laser beam output by the first laser head and the power level of the laser beam output by the second laser head is smaller than the minimum power level.

Alternatively, the distribution trajectory is of a closed rectangular shape.

Alternatively, when the first region is heated by the first laser head, the laser sintering method further includes driving a third laser head to move along the distribution trajectory, thereby to enable the first laser head, the second laser head and the third laser head to move in the first direction at the identical speed and enable the third laser head to heat a third region along the distribution trajectory. The third region is adjacent to the second region, and a direction from the third region to the second region and a direction from the second region to the first region are the first direction. The power level of the laser beam output by the second laser head is larger than or equal to the minimum power level, and both the power level of the laser beam output by the first laser head and a power level of a laser beam output by the third laser head are smaller than the minimum power level.

In still yet another aspect, the present disclosure provides in some embodiments a laser sintering apparatus, includes: a first laser head configured to output a laser beam at a first power level; a second laser head configured to output a laser beam at a second power level; and a driving device configured to drive the first laser head and the second laser head to move along a distribution trajectory of a to-be-sintered material in a first direction at an identical speed, thereby to enable the first laser head to heat a first region along the distribution trajectory and enable the second laser head to heat a second region along the distribution trajectory. The first region is adjacent to the second region, and a direction from the second region to the first region is the first direction. One of the first power level and the second power level is larger than or equal to a minimum power level desired for sintering the to-be-sintered material, and the other one of the first power level and the second power level is smaller than the minimum power level.

Alternatively, the laser sintering apparatus further includes a third laser head configured to output a laser beam at a third power level. The driving device is further configured to drive the third laser head to move along the distribution trajectory, thereby to enable the first laser head, the second laser head and the third laser head to move in the first direction at the identical speed and enable the third laser head to heat a third region along the distribution trajectory. The third region is adjacent to the second region, and a direction from the third region to the second region and a direction from the second region to the first region are the first direction. The second power level is larger than or equal to the minimum power level, and both the first power level and the third power level are smaller than the minimum power level.

According to the embodiments of the present disclosure, an existing laser packaging device is provided with an additional laser head, and when heating the to-be-sintered material arranged on a to-be-sintered device, a certain to-be-heated region of the to-be-sintered material is heated by the two laser heads successively. In this way, it is able to preheat the to-be-sintered material before the sintering, or perform annealing treatment on the sintered material after the sintering, and reduce a difference between a temperature before the sintering and a temperature during the sintering or reduce a cooling rate after the sintering, thereby to reduce stresses of the to-be-sintered material and the substrate, and prevent the occurrence of cracks and even breakages due to the shrinkage stresses.

DETAILED DESCRIPTION OF THE EMBODIMENTS

In order to make the objects, the technical solutions and the advantages of the present disclosure more apparent, the present disclosure will be described hereinafter in conjunction with the drawings and embodiments.

The present disclosure provides in some embodiments a laser sintering apparatus, which includes: a first laser head configured to output a laser beam at a first power level, a second laser head configured to output a laser beam at a second power level, and a driving device configured to drive the first laser head and the second laser head to move, thereby to enable the first laser head and the second laser head to heat an identical region of a to-be-sintered material.

According to the laser sintering apparatus in the embodiments of the present disclosure, an existing laser packaging device is provided with an additional laser head, and when heating the to-be-sintered material arranged on a to-be-sintered device, a certain to-be-heated region of the to-be-sintered material is heated by the two laser heads successively. In this way, it is able to preheat the to-be-sintered material before the sintering, or perform annealing treatment on the sintered material after the sintering, and reduce a difference between a temperature before the sintering and a temperature during the sintering or reduce a cooling rate after the sintering, thereby to reduce stresses of the to-be-sintered material and the substrate, and prevent the occurrence of cracks and even breakages due to the shrinkage stresses.

Alternatively, when heating the identical region of the to-be-sintered material with the first laser head and the second laser head, the first laser head and the second laser head move simultaneously at an identical speed. In this way, when the first laser head and the second laser head are used to simultaneously scan a region of the to-be-sintered material in a mobile manner, this region is heated successively by the two laser heads. Hence, the entire laser sintering apparatus has a simple structure and is easy to control.

In the embodiments of the present disclosure, the second laser head outputs the laser beam at the second power level, the first laser head outputs the laser beam at the first power level, and the second power level is larger than the first power level. Specifically, the laser beam output by the second laser head is used for sintering a glass cement during the packaging and enabling the glass cement to reach a temperature ranging from 800° C. to 1000° C. The laser beam output by the first laser head is used for preheating the glass cement before it is being sintered or for annealing the glass cement after it has been sintered, so as to enable the heated glass cement to reach a temperature ranging from 400° C. to 500° C.

The laser sintering apparatus with the above-described structure may be applied to package a display device. The glass cement coated on a to-be-packaged display device is heated by a laser beam, so as to melt the glass cement and assemble two portions of the display device together. Accordingly, when applying the laser sintering apparatus to package a display device, the to-be-sintered device is the to-be-packaged display device, and the to-be-sintered material is the glass cement.

The structure of the laser sintering apparatus will be described hereinafter when it is applied to package a display device.

Figure 1:
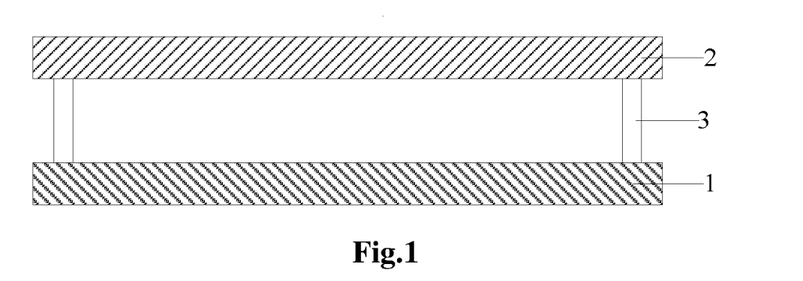
FIG. 1 is a sectional view of an existing display device.
Figure 2:
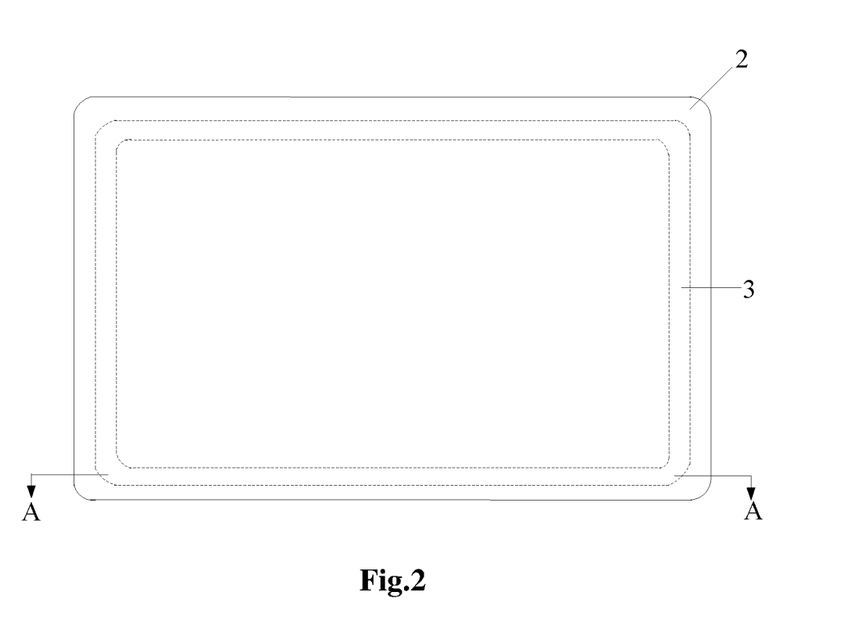
FIG. 2 is a plan view of the existing display device.

Referring to FIG. 1 which is a sectional view of an existing display device and FIG. 2 which is a plan view of the existing display device, the display device includes a back plate 1 and a cover plate 2 which are arranged opposite to and parallel to each other. An element for displaying an image is arranged between the back plate 1 and the cover plate 2. For an OLED display device, light-emitting functional layers are arranged between the back plate 1 and the cover plate 2. During the packaging, a glass cement 3 is coated at a periphery of a border portion of the back plate 1, the cover plate 2 is arranged above the light-emitting functional layers, and a region of the cover plate 2 corresponding to the glass cement is aligned by the laser beams output from the laser heads and scanned along the border, so as to sinter the glass cement and adhere the back plate 1 to the cover plate 2.

Figure 3:
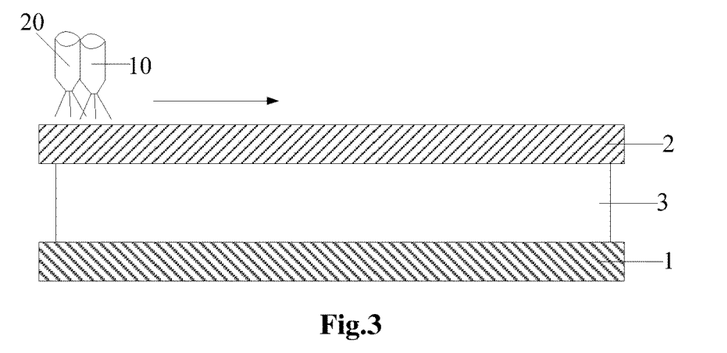
FIG. 3 is a schematic view showing the application of a laser sintering apparatus according to the first embodiment of the present disclosure.

FIG. 3 is a schematic view showing the application of the laser sintering apparatus according to the first embodiment of the present disclosure, where the laser sintering apparatus is arranged above a sectional plane along line A-A shown in FIG. 2. In the first embodiment, the first laser head 10 and the second laser head 20 are fixedly connected to each other, and scan the region of the cover plate 2 corresponding to the glass cement 3 at an identical speed. When a direction from the second laser head 20 to the first laser head 10 conforms to a scanning direction, that is, when the second laser head 20 is arranged upstream of the first laser head 10 in the scanning direction, the scanning is performed in a mobile manner. During the scanning in a mobile manner, when the laser beams are output by both the first laser head 10 and the second laser head 20, the laser beam from the first laser head 10 reaches the region of the cover plate 2 corresponding to the glass cement 3, and then the laser beam from the second laser head 20 reaches the identical region. When applying the laser sintering apparatus in this embodiment, the laser beam from the first laser head 10 is used for preheating the glass cement before it is being sintered, so as to enable the glass cement 3 to reach a temperature ranging from 400° C. to 500° C., and the laser beam from the second laser head 20 is used for sintering the glass cement 3 so as to enable the glass cement 3 to reach a temperature ranging from 800° C. to 1000° C. By preheating the glass cement of the to-be-packaged display before the laser sintering, it is able to reduce a difference between the temperature before the laser sintering and the temperature during the laser sintering, thereby to reduce the stresses of the glass cement and the glass substrate, and prevent the occurrence of cracks and even breakages due to the shrinkage stress.

Figure 4:
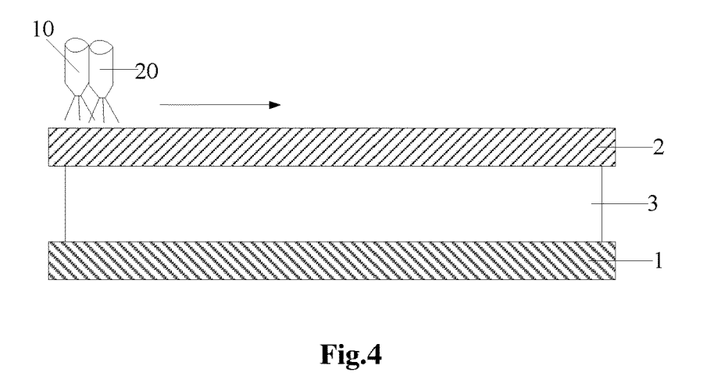
FIG. 4 is another schematic view showing the application of the laser sintering apparatus according to the second embodiment of the present disclosure.

FIG. 4 is another schematic view showing the application of the laser sintering apparatus according to the second embodiment of the present disclosure, where the laser sintering apparatus is also arranged above the sectional plane along line A-A shown in FIG. 2. Identical to the first embodiment, in the second embodiment, the first laser head 10 and the second laser head 20 are fixedly connected to each other, and scan the region of the cover plate 2 corresponding to the glass cement 3 at an identical speed. But different from the first embodiment, in the second embodiment, when a direction from the first laser head 10 to the second laser head 20 conforms to the scanning direction, that is, when the first laser head 10 is located upstream of the second laser head 20 in the scanning direction, the scanning is performed. When the laser beams are output by first laser head 10 and the second laser head 20 simultaneously, the laser beam from the second laser head 20 reaches the region of the cover plate 2 corresponding to the glass cement 3, and then the laser beam from the first laser head 10 reaches the identical region. When applying the laser sintering apparatus in this embodiment, the laser beam from the second laser head 20 is used to heat the glass cement 3, so as to enable the glass cement 3 to reach a temperature ranging from 800° C. to 1000° C. and to sinter the glass cement 3, and then the laser beam from the first laser head 10 reaches the region corresponding to the glass cement 3, and stops heating when the glass cement 3 slowly reaches a temperature ranging from 400° C. to 500° C., so as to perform the annealing treatment on the glass cement 3. As a result, it is able to reduce a cooling rate after the laser sintering, thereby to reduce the stresses of the glass cement and the glass substrate, and prevent the occurrence of cracks and even breakages due to the shrinkage stress.

Figure 5:
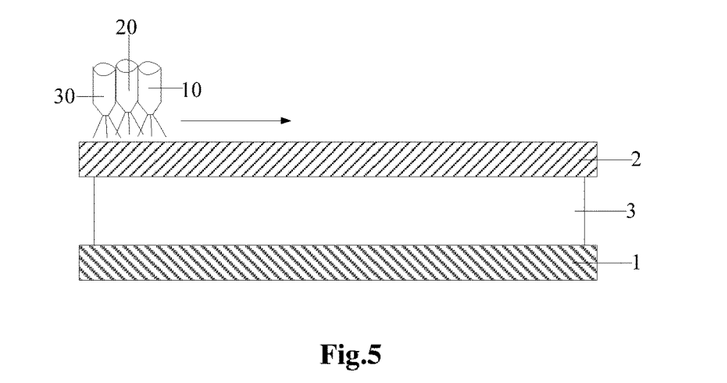
FIG. 5 is yet another schematic view showing the application of the laser sintering apparatus according to the third embodiment of the present disclosure.
Figure 6:
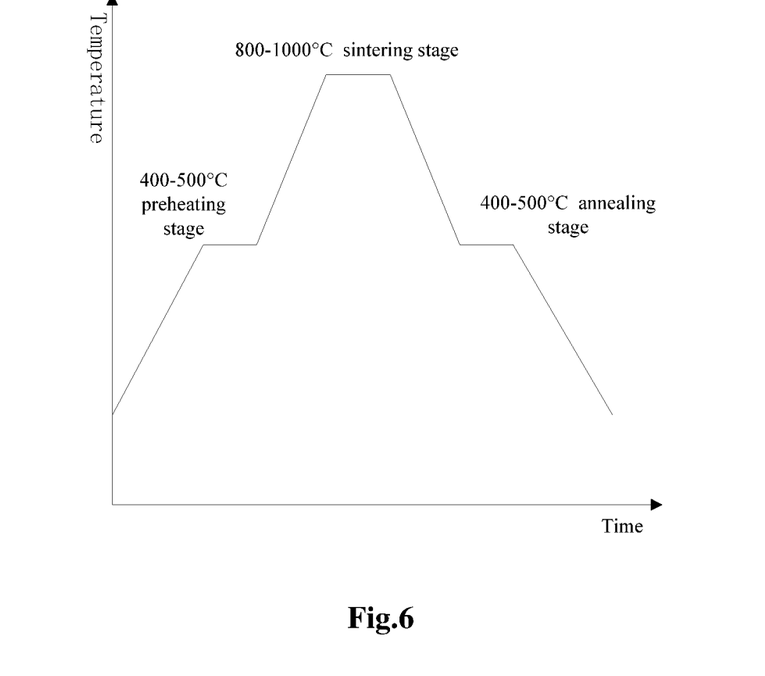
FIG. 6 is a diagram showing temperatures of a glass cement when three laser heads are used according to the third embodiment of the present disclosure.

FIG. 5 is yet another schematic view showing the application of the laser sintering apparatus according to the third embodiment of the present disclosure, where the laser sintering apparatus is also arranged above the sectional plane along line A-A shown in FIG. 2. In the third embodiment, in addition to the first laser head 10 and the second laser head 20, the laser sintering apparatus further includes a third laser head 30 configured to output a laser beam at a third power level smaller than the second power level. In the third embodiment, the first laser head 10, the second laser head 20 and the third laser head 30 are fixedly connected to each other, and scan the region of the cover plate 2 corresponding to the glass cement 3 at an identical speed. The driving device is further configured to enable the third laser head 30 to scan the region corresponding to the glass cement 3 together with the first laser head 10 and the second laser head 20, and the first laser head 10, the second laser head 20 and the third laser head 30 are used to heat the glass cement successively. In this way, the glass cement 3 is preheated by using the first laser head 10 so that the glass cement 3 reaches a temperature ranging from 400° C. to 500° C.; then, the glass cement 3 is sintered by using the second laser head 20 so that the glass cement 3 reaches a temperature ranging from 800° C. to 1000° C.; and then, the glass cement 3 is annealed by using the third laser head 30 so that the glass cement 3 is slowly cooled down to a temperature ranging from 400° C. to 500° C. As shown in FIG. 6, the temperature of the glass cement increases slowly before the laser sintering and decreases slowly after the laser sintering. By sintering and annealing the glass cement at the mentioned temperature gradients, it is able to reduce the stresses of the glass cement and the glass substrate, thereby to prevent the occurrence of cracks and even breakages due to the shrinkage stress.

As shown in FIG. 2, in the display device, the glass cement 3 is usually arranged along the border, thereby forming a closed rectangle on a plane where the cover plate 2 is located. When the glass cement 3 on the cover plate 2 is heated and scanned simultaneously using two or three laser heads, the relative position relation among the laser heads needs to be changed according to the shape of the glass cement 3, so as to ensure that the glass cement is heated by the laser heads in a fixed order. Therefore, in the embodiments of the present disclosure, the driving device is further configured to adjust positions of the respective laser heads.

Taking the three laser heads in the third embodiment as an example, the driving device specifically includes: a first controlling structure configured to enable the first laser head 10, the second laser head 20 and the third laser head 30 to scan the glass cement 3 in a first direction at an identical speed; and a second controlling structure configured to adjust positions of the first laser head 10, the second laser head 20 and/or the third laser head 30, so as to enable a direction from the second laser head 20 to the first laser head 10 and a direction from the third laser head 30 to the second laser head 20 always to be identical to the first direction.

That is to say, a direction along which the third laser head 30, the second laser head 20 and the first laser head 10 are arranged is identical to the scanning direction by adjusting the positions of the first laser head 10, the second laser head 20 and/or the third laser head 30. Accordingly, when the scanning is performed in the scanning direction, the glass cement 30 at an identical region are heated by the first laser head 10, the second laser head 20 and the third laser head 30 successively.

The first direction refers to a direction of a movement along the glass cement at the border of the display device during the packaging. It should be noted that, the border of the display device is usually of a rectangular shape and so does the glass cement arranged along the border. Hence, when the glass cement is heated and cured using the laser sintering apparatus during the packaging, a scanning direction of the laser beam varies along with a shape of the glass cement, that is, the first direction varies along with the shape of the glass cement. The above-described movement and scanning procedures of the respective laser heads are just the heating and curing procedures of the glass cement.

Figure 7:
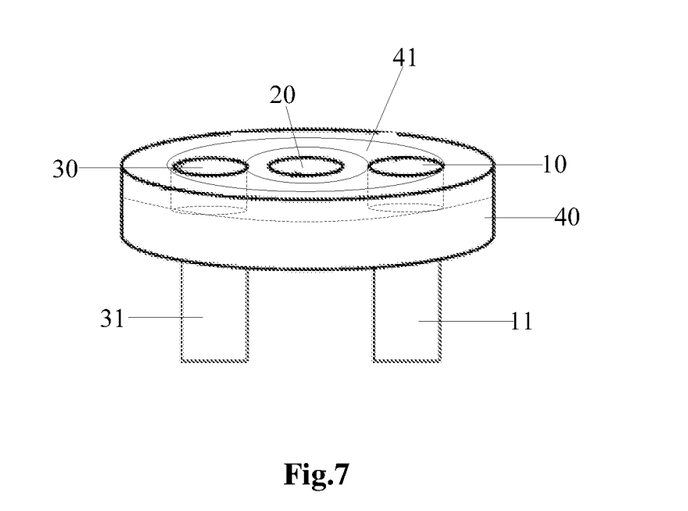
FIG. 7 is a solid view of a laser sintering apparatus according to the fourth embodiment of the present disclosure.
Figure 8:
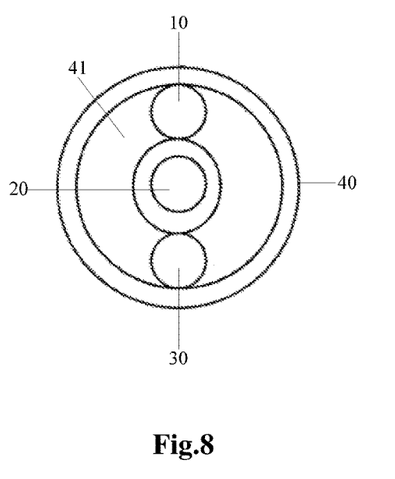
FIG. 8 is a plan view of the laser sintering apparatus according to the fourth embodiment of the present disclosure.

In order to adjust the positions of the respective laser heads in an easy and convenient manner, as shown in FIGS. 7 and 8, in the fourth embodiment, the laser sintering apparatus further includes a fixation platform 40. A circular rail 41 is provided on the fixation platform 40, the second laser head 20 is fixedly arranged at a center of a region surrounded by the circular pathway 41, and the first laser head 10 and the third laser head 30 are arranged on the circular pathway 41 and located at two sides of the second laser head 20, respectively.

Furthermore, the driving device includes a first motor 11 connected to the first laser head 10 and configured to enable the first laser head 10 to move along the circular rail 41, and a second motor 31 connected to the third laser head 30 and configured to enable the third laser head 30 to move along the circular rail 41.

Figure 9:
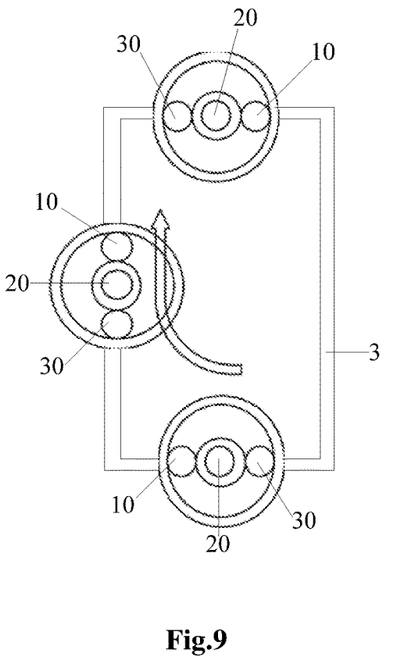
FIG. 9 is a schematic view showing a case where a scanning direction of the laser sintering apparatus is changed according to the fourth embodiment of the present disclosure.

With the above-described structure, as shown in FIG. 9, when the glass cement 3 is scanned and heated by the laser sintering apparatus and the scanning direction is changed, the first motor 11 is used to enable the first laser head 10 to rotate around the second laser head 20 on the circular rail 41, and the second motor 31 is used to enable the third laser head 30 to rotate around the second laser head 20 on the circular rail 41. Hence, no matter how the scanning direction is changed, it is still able to ensure that the direction along which the third laser head 30, the second laser head 20 and the first laser head 10 are arranged is identical to the scanning direction.

In the laser sintering apparatuses according to the third embodiment and the fourth embodiment, the first power level of the laser beam from the first laser head 10 and the third power level of the laser beam from the third laser head 30 are each smaller than the second power level of the laser beam from the second laser head 20 by 20% to 40%. In addition, the first power level may be equal to the third power level, but it is not limited thereto. Alternatively, a distance from the second laser head 20 to the first laser head 10 and a distance from the second laser head 20 to the third laser head 30 each range from 2 mm to 5 mm. Through such structure parameters and process parameters, it is able to ensure a better sintering effect.

In addition, alternatively, light paths of the laser beams from the first laser head 10, the second laser head 20 and the third laser head 30 are parallel to each other, and the region where the glass cement 3 is located is irradiated by the laser beams in a direction perpendicular to a plane where the cover plate 2 is located.

In another aspect, the present disclosure provides in some embodiments a laser sintering method using the above-mentioned laser sintering apparatus, which includes steps of: outputting, by the first laser head, the laser beam at a first power level; outputting, by the second laser head, the laser beam at the second power level; and moving the first laser head and the second laser head to heat an identical region of the to-be-sintered material.

Alternatively, in the step of heating the identical region of the to-be-sintered material by the first laser head and the second laser head, the first laser head and the second laser head move simultaneously at an identical speed.

The laser sintering apparatus with the above-described structure may be applied to package a display device. The glass cement coated on a to-be-packaged display device is heated by a laser beam, so as to melt the glass cement and assemble two portions of the display device together. Accordingly, when applying the laser sintering apparatus to package a display device, the to-be-sintered device is the to-be-packaged display device, and the to-be-sintered material is the glass cement.

When the laser sintering method in the embodiments of the present disclosure are used to package a display device, the laser beam from the second laser head is used to enable the glass cement to reach a temperature ranging from 800° C. to 1000° C., so as to sinter the glass cement. The first laser head is used to heat the glass cement to a temperature ranging from 400° C. to 500° C. To be specific, the first laser head may be used to heat the glass cement before sintering with the second laser head, so as preheat the glass cement, thereby to reduce a difference between a temperature before the laser sintering and a temperature during the laser sintering. Alternatively, the first laser head may also be used to heat the glass cement after sintering with the second laser head, so as to anneal the sintered glass cement, thereby to reduce a cooling rate of the glass cement after the laser sintering. As a result, it is able to reduce the stresses of the to-be-sintered material and the substrate, thereby to prevent the occurrence of cracks and even breakages due to the shrinkage stress.

Further, the laser sintering method includes: outputting, by the third laser head, the laser beam at the third power level, where the third power level and the first power level are each smaller than the second power level; and heating an identical region of the to-be-sintered material by the first laser head, the second laser head and the third laser head.

During the packaging, the glass cement is preheated by the first laser head so that the glass cement reaches a temperature ranging from 400° C. to 500° C.; then the second laser head is used to sinter the glass cement so as to enable the glass cement to reach a temperature ranging from 800° C. to 1000° C.; and then, the third laser head is used to anneal the glass cement so as to enable the glass cement to be slowly cooled down to a temperature ranging from 400° C. to 500° C. By sintering and annealing the glass cement at the mentioned temperature gradients, it is able to reduce the stresses of the glass cement and the glass substrate, thereby to prevent the occurrence of cracks and even breakages due to the shrinkage stress, and improve the sintering effect. Alternatively, the step of heating the identical region of the to-be-sintered material by the first laser head, the second laser head and the third laser head specifically includes moving the first laser head, the second laser head and the third laser head along a first direction at an identical speed to scan the identical region of the to-be-sintered material.

In addition, the step of moving the first laser head, the second laser head and the third laser head in the first direction at the identical speed further includes adjusting positions of the first laser head, the second laser head and/or the third laser head, thereby to enable a direction from the second laser head to the first laser head and a direction from the third laser head to the second laser head to be identical to the first direction.

In addition, alternatively, both the first power level and the third power level are smaller than the second power level by 20% to 40%.

According to the laser sintering apparatus and the laser sintering method in the embodiments of the disclosure, it is able to reduce the stresses of the glass cement and the glass substrate, and prevent the occurrence of cracks and even breakages due to the shrinkage stress, thereby to improve the yield.

The above are merely the preferred embodiments of the present disclosure. It should be noted that, a person skilled in the art may make further modifications and improvements without departing from the principle of the present disclosure, and these modifications and improvements shall also fall within the scope of the present disclosure.

What is claimed is:

1. A laser sintering apparatus, comprising:
    a first laser head configured to output a laser beam at a first power level;
    a second laser head configured to output a laser beam at a second power level;
    a third laser head configured to output a laser beam at a third power level, wherein the third power level and the first power level are each smaller than the second power level;
    a driving device configured to drive the first laser head, the second laser head and the third laser head to move, so as to enable the first laser head, the second laser head and the third laser head to heat an identical region of a to-be-sintered material; and
    a fixation platform, wherein a circular rail is provided on the fixation platform, the second laser head is fixedly arranged at a center of a region surrounded by the circular rail, the first laser head and the third laser head are arranged on the circular rail and located at two sides of the second laser head, respectively.

2. The laser sintering apparatus according to claim 1, wherein the driving device is configured to drive the first laser head and the second laser head to move simultaneously at an identical speed.

3. The laser sintering apparatus according to claim 1, wherein the driving device comprises:
    a first controlling structure configured to enable the first laser head, the second laser head and the third laser head to move in a first direction at an identical speed, so as to scan the to-be-sintered material; and
    a second controlling structure configured to adjust positions of the first laser head, the second laser head and/or the third laser head, so as to enable a direction from the second laser head to the first laser head and a direction from the third laser head to the second laser head to be identical to the first direction.

4. The laser sintering apparatus according to claim 1, wherein the driving device comprises a first motor connected to the first laser head and configured to enable the first laser head to move along the circular rail, and a second motor connected to the third laser head and configured to enable the third laser head to move along the circular rail.

5. The laser sintering apparatus according to claim 1, wherein the first power level and the third power level are each smaller than the second power level by 20% to 40%.

6. The laser sintering apparatus according to claim 1, wherein a distance from the second laser head to the first laser head and a distance from the second laser head to the third laser head both range from 2 mm to 5 mm.

7. The laser sintering apparatus according to claim 1, wherein light paths of the laser beams from the first laser head, the second laser head and the third laser head are parallel to each other.

8. A laser sintering method using the laser sintering apparatus according to claim 1, comprising steps of:
outputting, by the first laser head, a laser beam at a first power level;
outputting, by the second laser head, a laser beam at a second power level; and
moving the first laser head and the second laser head to heat an identical region of a to-be-sintered material.

9. The laser sintering method according to claim 8, further comprising:
outputting, by the third laser head, a laser beam at a third power level, where the third power level and the first power level are each smaller than the second power level; and
heating the identical region of the to-be-sintered material by the first laser head, the second laser head and the third laser head.

10. The laser sintering method according to claim 9, wherein the step of heating the identical region of the to-be-sintered material by the first laser head, the second laser head and the third laser head includes moving the first laser head, the second laser head and the third laser head along a first direction at an identical speed to scan the identical region of the to-be-sintered material.

11. The laser sintering method according to claim 10, wherein the step of moving the first laser head, the second laser head and the third laser head in the first direction at the identical speed further comprises:
adjusting positions of the first laser head, the second laser head and/or the third laser head, thereby to enable a direction from the second laser head to the first laser head and a direction from the third laser head to the second laser head to be identical to the first direction.

12. The laser sintering method according to claim 9, wherein the first power level and the third power level are each smaller than the second power level by 20% to 40%.

13. The laser sintering method according to claim 8, wherein in the step of heating the identical region of the to-be-sintered material by the first laser head and the second laser head, the first laser head and the second laser head move simultaneously at an identical speed.

14. A laser sintering apparatus, comprising:
a first laser head configured to output a laser beam at a first power level;
a second laser head configured to output a laser beam at a second power level;
a third laser head configured to output a laser beam at a third power level;
a driving device configured to drive the first laser head, the second laser head and the third laser head to move along a distribution trajectory of a to-be-sintered material in a first direction at an identical speed, thereby to enable the first laser head to heat a first region along the distribution trajectory, enable the second laser head to heat a second region along the distribution trajectory, and enable the third laser head to heat a third region along the distribution trajectory; and
a fixation platform, wherein a circular rail is provided on the fixation platform, the second laser head is fixedly arranged at a center of a region surrounded by the circular rail, the first laser head and the third laser head are arranged on the circular rail and located at two sides of the second laser head, respectively;
wherein the first region is adjacent to the second region, the third region is adjacent to the second region, and a direction from the third region to the second region and a direction from the second region to the first region are the first direction; and
wherein the second power level is larger than or equal to a minimum power level desired for sintering the to-be-sintered material, and both the first power level and the third power level are smaller than the minimum power level.

\* \* \* \* \*